United States Patent [19]

Ufkes

[11] Patent Number: 4,592,094
[45] Date of Patent: May 27, 1986

[54] RECEIVER COMPRISING A SEARCH TUNING CIRCUIT HAVING MEANS FOR FINDING THE TUNING DATA OF A SEARCH-TUNED TRANSMISSION AFTER MANUAL TUNING

[75] Inventor: Pieter J. Ufkes, Veldhoven, Netherlands

[73] Assignee: U.S. Philips Corporation, New York, N.Y.

[21] Appl. No.: 647,246

[22] Filed: Sep. 4, 1984

[30] Foreign Application Priority Data

Sep. 16, 1983 [NL] Netherlands .......................... 8303203

[51] Int. Cl.⁴ .......................... H03J 7/22; H04N 5/50
[52] U.S. Cl. .................................. 455/164; 358/193.1; 358/195.1
[58] Field of Search ............... 455/161, 163, 164, 169, 455/167; 358/193.1, 195.1

[56] References Cited

U.S. PATENT DOCUMENTS

| 4,387,401 | 6/1983 | Henderson et al. | 358/193.1 |
| 4,419,767 | 12/1983 | Motohashi | 455/164 |
| 4,429,415 | 1/1984 | Chin et al. | 455/164 |
| 4,498,191 | 2/1985 | Rogers | 455/164 |

*Primary Examiner*—Jin F. Ng
*Attorney, Agent, or Firm*—Thomas A. Briody; William J. Streeter; Edward W. Goodman

[57] ABSTRACT

In a receiver comprising a forward-reverse-stop search tuning circuit (43, 33, 35, 23, 19, 13) and a manual control circuit (37, 33, 35), a last-found transmission blocking circuit (45) is used which, with the aid of a control element (115), can be adjusted to a state which causes, after a restart of the search tuning circuit, tuning to the transmission found last to be effected, so that any manual tuning effected after a first search tuning action is corrected.

8 Claims, 1 Drawing Figure

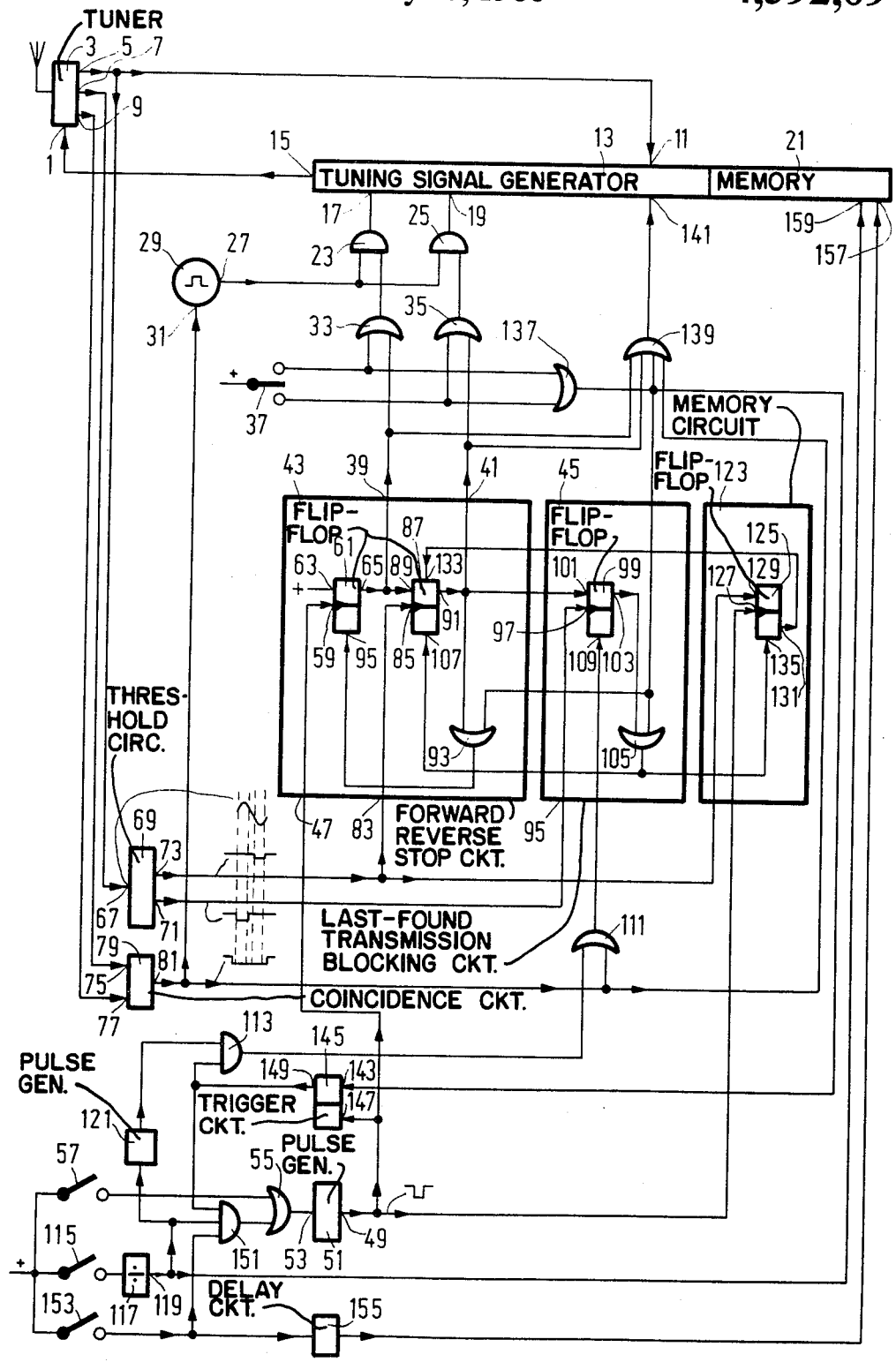

RECEIVER COMPRISING A SEARCH TUNING CIRCUIT HAVING MEANS FOR FINDING THE TUNING DATA OF A SEARCH-TUNED TRANSMISSION AFTER MANUAL TUNING

BACKGROUND OF THE INVENTION

The invention relates to a receiver comprising a search tuning circuit having a forward-reverse-stop circuit whose action causes the tuning of the receiver to proceed in a given forward direction after a search tuning action has started, to reverse in response to a signal received and to stop when tuning is substantially correct, having a last-found-transmission blocking circuit to prevent the same transmission from being tuned to at a restart of a search tuning action and having a manual control circuit by means of which a tuning found by a search tuning action can be changed.

IEEE Transactions on Consumer Electronics 1979, No. 4, pages 606–620, discloses a receiver of the above-mentioned type, in which the last-found-transmission blocking circuit is a circuit with which, during a plurality of steps after a restart of the search tuning circuit, the response to the signal from which a reverse and stop action must be derived, is suppressed. A tuning datum found by the search tuning circuit can be changed with the manual control circuit. A tuning datum obtained by this changed tuning can, if so desired, be stored in a tuning data store. This feature has been found to be often the cause that an incorrect tuning datum is stored, for example a tuning datum located outside an AFC pull-in range.

SUMMARY OF THE INVENTION

It is an object of the invention to provide the possibility to find again, rapidly after a manual tuning operation, the tuning datum found by a preceding search tuning action.

According to the invention, a receiver of the type set forth in the opening paragraph, is characterized in that the last-found-transmission blocking circuit comprises a first trigger circuit, an output of which is coupled to a reverse-reset input of the forward-reverse-stop circuit, the first trigger circuit being adapted to be set by a combination of a reverse output signal of the forward-reverse-stop circuit and a tuned-too-near signal, and reset by a control element for rendering the last-found-transmission blocking circuit inoperative and by a receiving condition signal.

Because of this measure, when a search tuning action is restarted, the search tuning circuit tunes to the transmission found last, so that the correct tuning datum associated therewith can be found again very rapidly.

A further development of a receiver according to the invention, is characterized in that it comprises a tuned-too-far memory circuit comprising a second trigger circuit which can be set by a combination of a search tuning start signal and a tuned-too-far signal, and reset by an output signal of the first trigger and an output of which is coupled to a reverse-setting input of the forward-reverse-stop circuit.

As a result thereof it is also possible to find again a transmission found last by the search tuning circuit, after a comparatively large detuning of the tuning circuit in the forward direction.

If a receiver according to the invention is characterized in that the manual control circuit is coupled to a setting input of a third trigger circuit whose resetting input is coupled to a forward-setting input of the forward-reverse-stop circuit, while an output of this third trigger circuit is coupled to a resetting input of the first trigger circuit via a gate circuit, a further input of which is coupled to said control element for rendering the last-found transmission blocking circuit inoperative, then the last-found transmission blocking circuit is made inoperative after manual operation, so that no search action to the same transmission takes place when the last tuning action was a search action.

DESCRIPTION OF THE DRAWING

The invention will now be further described by way of example with reference to the accompanying drawing.

The drawing which comprises only one FIGURE, illustrates by means of a block circuit diagram a possible embodiment of a receiver according to the invention.

DESCRIPTION OF THE PREFERRED EMBODIMENT

In the FIGURE, a tuning voltage is applied to an input 1 of a tuner section 3 of the receiver, in response to which this tuner section 3 is tuned and, upon reception of a transmission an AFC signal is produced at an output 5 and a line synchronizing signal at an output 7. A line flyback signal is supplied from an output 9. It is assumed here that the receiver is a television receiver. In the event of a radio receiver, the output 7 can, for example, supply a rectified AFC signal and the output 9 an AVC signal.

The output 5 of the tuner section 3 is connected to an input 11 of a tuning signal generator 13, an output 15 of which applies to the input 1 of the tuner section 3 a tuning signal which determines the tuning of the receiver.

This tuning signal is, for example, obtained from a digital-to-analog converter arranged at an output of a counter whose counting position can be incremented or decremented, respectively, by pulses to be applied to an input 17 or 19, respectively, or whose position can be determined by tuning data stored in a tuning memory 21. As further particulars of this receiver section, which is known per se are not important for an understanding of the invention, they are not shown in the drawing for the sake of clarity.

The pulses at the inputs 17 or 19, respectively, of the tuning signal generator 13 are obtained from AND-gates 23 and 25, respectively, an input of each being connected to an output of a pulse generator 29, whose frequency is determined by a receiving condition signal applied to an input 31 thereof. The other inputs of the AND-gates 23 and 25, respectively, are connected to outputs of OR-gates 33 and 35, respectively, an input of each being connected to a manual control circuit 37 by means of which a logic "one" signal can be applied to the relevant input of one of the OR-gates 33, 35 for manual tuning of the receiver.

Further inputs of/the OR-gate 33 and 35, respectively, are connected to forward and reverse outputs 39 and 41, respectively, of a forward-reverse-stop circuit 43, which, together with a last-found transmission blocking circuit 45, forms part of a search tuning circuit.

This search tuning circuit can be started by applying a forward-start signal to a forward-start input 47 of the forward-reverse-stop circuit 43. This forward-start signal is received from an output 49 of a pulse generator 51, which produces a logic "one" pulse when a logic "one" signal is produced at its input 53 which is connected to an output of an OR-gate 55. This is the case when a search tuning start switch 57, which is connected to an input of the OR-gate 55, is closed.

The pulse then applied to the forward-start input 47 of the forward-reverse-stop circuit 43 sets, via a clock signal input 59, a first D-flip-flop 61, a D-input 63 of which is connected to a positive voltage. As a result thereof, an output 65 of the D-flip-flop 61 becomes "one" and the output 39 of the forward-reverse-stop circuit 43 connected thereto becomes consequently also "one", as a result of which the tuning of the receiver is effected in a forward direction. On receipt of a transmission, an AFC signal is produced at the output 5 of the tuner section 3, which signal is applied to an input 67 of a threshold circuit 69 which in response thereto successively supplies a tuned-too-near or a tuned-too-far signal, respectively, from an outputs 71 and 73, respectively.

The signals at the outputs 7 and 9 of the tuner section 3 of the receiver are applied to respective inputs 75 and 77 of a coincidence circuit 79 which supplies from its output 81 the receiving state signal which, when there is coincidence between the line synchronizing signals and the line flyback signals, is logic one which, on reception of a transmission, causes the frequency of the signal produced by the pulse generator 29 to be decreased, as a result of which the search rate decreases.

The tuned-too-far signal at the output 73 of the threshold circuit 69, which becomes zero when tuning has proceeded too far, is applied to a tuned-too-far input 83 of the forward-reverse-stop circuit 43, which is connected to a clock signal input 85 of a second D-flip-flop 87 a D-input 89 of which is connected to the output 65 of the first D-flip-flop 61. Since, as described above, the output 65 of the first D-flip-flop becomes logic "one", an output 91 of the second D-flip-flop 87 now becomes logic "one". The signal at this output 91, which is connected to a reset input 95 of the first D-flip-flop 61 via an OR-gate 93, now resets this first D-flip-flop 61. The reverse-stroke output 41 of the forward-reverse-stop circuit 43 connected to the output 91 of the second flip-flop 87 is now logic "one" and the forward-stroke output 39 is logic "one"; tuning of the receiver now proceeds in the reverse direction.

This reverse movement is stopped by the tuned-too-near signal at the output 71 of the threshold circuit 69, which then becomes logic "zero" and, via an input 95 of the last found-transmission-blocking circuit 45 and a clock signal input 97 of a third-D-flip-flop 99 sets this third D-flip-flop 99; as its D-input 101 is connected to the output 91 of the second D-flip-flop 87, this third D-flip-flop 99 functioning as a first trigger circuit.

An output 103 of the third D-flip-flop 99 now becomes logic "one" and, via an OR-gate 105, a reset input 107 of the second D-flip-flop 87 becomes logic "one" causing this second D-flip-flop 87 to be reset and the tuning of the receiver to stop. A reset-input 109 of the third D-flip-flop 99 is connected to an output of an OR-gate 111, an input of which receives the receiving state signal from the output 81 of the coincidence circuit 79. As a result thereof, the third D-flip-flop 99, which functions as the first trigger circuit, operates as a last found-transmission-blocking circuit at a restart of the search tuning circuit, as it keeps the second D-flip-flop 87 in the reset state until the receiving state signal becomes logic "one" again, causing the third D-flip-flop 99 to be reset and the reset signal at the reset input 107 of the second D-flip-flop 87 to disappear.

The third D-flip-flop 99, which functions as the first trigger circuit, can also be reset by applying to a second input of the OR-gate 111, a signal which may be received from an AND-gate 113 when a control element 115 is operated. In response thereto, a divide-by-two divider 117 changes state and supplies from its output 119 a logic "one" signal which is applied to a pulse generator 121 which then supplies a pulse which is applied to an input of the AND-gate 113. The other input of the AND-gate 113 is logic "one" when the last tuning action of the receiver was manual tuning by means of the manual tuning circuit 37, as will be described in greater detail hereinafter.

So, if the last tuning action was a manual tuning action, the third D-flip-flop 99 is reset by the output signal of the OR-gate 111 when the control element 115 is operated, as a result of which the blocking of the last-found transmission of the search tuning circuit is cancelled.

Restarting the search tuning circuit in response to a starting pulse applied to the forward-start-input 47 of the forward-reverse-stop circuit 43 renders it possible to tune again to the last-found transmission with the aid of the search tuning circuit. Because of the presence of a tuned-too-far memory circuit 123, this is even possible when the receiver was detuned too far towards a subsequent transmitter by the manual tuning circuit 37, as a result of which the receiver would move outside the tuning range with a good reception of the last-found transmitter, when the search tuning circuit were started in the forward direction.

The tuned-too-far memory circuit 123 comprises a fourth D-flip-flop 125 which functions as a second trigger circuit and a clock signal input 127 of which receives the starting signal from the output 49 of the pulse generator 51 and a D-input 129 receives the tuned-too-far signal from the output 73 of the threshold circuit 69. An output 131 of the fourth D-flip-flop 125 then becomes logic "one", which also holds for a set-input 133 of the second D-flip-flop 87 connected thereto, which creates the reverse stroke state of the forward-reverse-stop circuit 43 and the search tuning circuit yet tunes to the last-found transmission. A reset input 135 of the fourth D-flip-flop 125 is connected to the output of the OR-gate 105 so that also the fourth D-flip-flop 125 is reset, on stopping of the search tuning circuit.

The OR-gates 93 and 105 have further inputs respectively which are connected to an output of an OR-gate 137, the inputs of which are connected to the manual control circuit 37, so that when tuning the receiver is effected manually, the search tuning circuit is adjusted to its stop condition.

The output signal of the OR-gate 137, and also the signals at/the forward and reverse outputs 39 and 41 and the receiving-state signal at the output 81 of the coincidence circuit 79, are applied to an OR-gate 139 whose output is connected to an input 141 of the tuning signal generator 13, which causes the AFC to be switched off during manual tuning, during search tuning and outside the tuning range in which reception is good.

The output signal of the OR-gate 137 is further applied to a setting input 143 of a third trigger circuit 145 a resetting input 147 of which is connected to the output 49 of the pulse generator 41. So, the state of this third trigger circuit 145 indicates whether the last tuning operation was a manually effected operation or a search tuning action. In the event it was a manual operation, an output 149 of the third trigger circuit 145 becomes logic one and, as a consequence thereof, also the above-mentioned input of the AND-gate 113 and an input of an AND-gate 151 whose output is connected to a further input of the OR-gate 55.

The further inputs of the AND-gate 151 are connected to the output 119 of the divide-by-two divider 117 and to a switch 153 which is further connected to a write-command signal input 157 of the tuning data memory circuit 21. A prepare-to-write command input 159 of the tuning data memory circuit 21 is connected to the output 119 of the divide-by-two divider 117.

When the control element 115 is operated for the first time, the output 119 of the divide-by-two divider 117 assumes, as stated above, the logic one state, as a result of which, as also described above, tuning to the transmission found last is possible when the search tuning action is restarted after manual operation of the transmitter. When the control element 115 is operated for the second time, the output 119 of the divide-by-two divider 117 assumes the logic "one" state, in which situation the pulse generator 121 does not supply a signal and consequently any manual operation of the tuning between the first and the second time the control element 115 is operated, cannot cause a change in the state of the third D-flip-flop 99. The prepare-to-write command for the tuning data memory circuit 21 is indeed reinstated thereby, as a result of which a preparation program, which was started the first time the control element 114 was operated, is reset to its initial state.

When the switch 153 is closed, when the control element 115 has been operated for the first time and a manual tuning operation has not been effected, a search tuning action which tunes to the transmission found last as the last-found transmission blocking circuit 45 has been adjusted to the reset state because of the fact the control element 115 was operated, is started via the AND-gate 151, the OR-gate 55 and the pulse generator 51. Due to the delay produced by a delay circuit 155, a write command is applied after this search tuning action to the input 157 of the tuning data memory 21 in which the tuning datum corrected by the search tuning action is then written. Consequently, an incorrect value of a tuning datum cannot be written in the tuning data memory 157.

It will be obvious that if so desired, the divide-by-two divider 117 and the input of the AND-gate 151, which input is connected to the switch 153, can be omitted, as a result of which each time the control element 115 is operated, a search tuning action to the transmission found last is started after a manual tuning operation. A still further simplification can be accomplished, if so desired, by also omitting the third trigger circuit 145 and to substitute a through-connection for the AND-gates 113 and 151 and also the pulse generator 121.

To render inoperative the blocking of tuning to the transmission found last at a restart of the search tuning circuit, the presence of the tuned-too-far memory circuit 123 is no absolute condition as will be understood from the above description.

The third and fourth flip-flops 99 and 125, respectively, which function as first and second trigger circuits, respectively can, if so desired, be replaced by other trigger circuits, for example set-reset triggers, by producing a set signal from the signal combinations at the inputs 101, 97 and 129, 127, respectively.

The expressions set and reset may of course be interchanged when the logic values of the desired input or output signals are chosen differently or if other types of flip-flops are used.

The forward-reverse-stop circuit may, if so desired, be of a construction different from the construction described in the above embodiment. The same applies for the other portions of the circuit, provided they continue to satisfy the conditions mentioned in the claims.

What is claimed is:

1. A receiver comprising a search tuning circuit having a forward-reverse-stop circuit whose action causes the tuning of the receiver to proceed in a given forward direction after a search tuning action has started, to reverse in response to a signal received and to stop when tuning is substantially correct, having a last-found-transmission blocking circuit to prevent the same transmission from being tuned to at a restart of a search tuning action and having a manual control circuit by means of which a tuning found by a search tuning action can be changed, characterized in that the last-found transmission blocking circuit comprises a first trigger circuit an output of which is coupled to a reverse-reset input of the forward-reverse-stop circuit, the first trigger circuit being adapted to be set by a combination of a reverse output signal of the forward-reverse-stop circuit and a tuned-too-near signal and reset by a control element for rendering the last-found transmission blocking circuit inoperative and by a receiving condition signal.

2. A receiver as claimed in claim 1, characterized in that it comprises a tuned-too-far memory circuit comprising a second trigger circuit which can be set by a combination of search tuning start signal and a tuned-too-far signal, and reset by an output signal of the first trigger circuit and an output of which is coupled to a reverse set input of the forward-reverse-stop circuit.

3. A receiver as claimed in claim 2, characterized in that the manual control circuit is coupled to a setting input of a third trigger circuit whose resetting input is coupled to a forward-setting input of the forward-reverse-stop circuit, while an output of this third trigger circuit is coupled to a resetting input of the first trigger circuit via a gate circuit a further input of which is coupled to said control element for rendering the last-found transmission blocking circuit inoperative.

4. A receiver as claimed in claim 3, characterized in that the manual control circuit is coupled to a forward-reset input and to the reverse-reset input of the forward-reverse-stop circuit.

5. A receiver as claimed in claim 2, characterized in that the manual control circuit is coupled to a forward-reset input and to the reverse-reset input of the forward-reverse-stop circuit.

6. A receiver as claimed in claim 1, characterized in that the manual control circuit is coupled to a setting input of a third trigger circuit whose resetting input is coupled to a forward-setting input of the forward-reverse-stop circuit, while an output of this third trigger circuit is coupled to a resetting input of the first trigger circuit via a gate circuit a further input of which is coupled to the said control element for rendering the last-found transmission blocking circuit inoperative.

7. A receiver as claimed in claim 6, characterized in that the manual control circuit is coupled to a forward-reset input and to the reverse-reset input of the forward-reverse-stop circuit.

8. A receiver as claimed in claim 1, characterized in that the manual control circuit is coupled to a forward-reset input and to the reverse-reset input of the forward-reverse-stop circuit.

* * * * *